(12) United States Patent
Ishida et al.

(10) Patent No.: US 8,217,486 B2
(45) Date of Patent: *Jul. 10, 2012

(54) SEMICONDUCTOR DEVICE AND METHOD OF PROCESSING THE SAME

(75) Inventors: Hiroyasu Ishida, Gunma (JP); Yasuyuki Sayama, Gunma (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 482 days.

This patent is subject to a terminal disclaimer.

(21) Appl. No.: 12/236,348

(22) Filed: Sep. 23, 2008

(65) Prior Publication Data

US 2009/0085149 A1 Apr. 2, 2009

(30) Foreign Application Priority Data

Sep. 27, 2007 (JP) ................................. 2007-252200

(51) Int. Cl.
  *H01L 27/00* (2006.01)
  *H01L 21/20* (2006.01)
(52) U.S. Cl. ................. 257/499; 257/E27.001; 438/478
(58) Field of Classification Search .................. 257/499, 257/327; 438/135, 289
  See application file for complete search history.

(56) References Cited

U.S. PATENT DOCUMENTS

| 5,177,028 A * | 1/1993 | Manning ........................ 438/289 |
| 2005/0006699 A1* | 1/2005 | Sato et al. ...................... 257/327 |
| 2005/0048701 A1* | 3/2005 | Minato et al. ................. 438/135 |
| 2009/0075461 A1* | 3/2009 | Ishida et al. ................... 438/492 |

FOREIGN PATENT DOCUMENTS

WO  WO-02/067333  8/2002

OTHER PUBLICATIONS

Ishida et al., U.S. Office Action mailed Dec. 22, 2009, directed to U.S. Appl. No. 12/199,547; 6 pages.
Ishida, H., et al., U.S. Office Action mailed on Jun. 22, 2010, directed to U.S. Appl. No. 12/199,547; 7 pages.

* cited by examiner

*Primary Examiner* — Jarrett Stark
*Assistant Examiner* — Lawrence Tynes, Jr.
(74) *Attorney, Agent, or Firm* — Morrison & Foerster LLP

(57) ABSTRACT

Provided is a semiconductor wafer. In the semiconductor wafer, formation and etching of an n type epitaxial layer and formation and etching of a p type epitaxial layer are alternately performed for at least three times, so that all semiconductor layers are formed of epitaxial layers on a semiconductor substrate. Thereby, the respective semiconductor layers can be formed to have reduced widths. Thus, if a required breakdown voltage is the same, dopant concentrations of the respective semiconductor layers can be increased and a resistance value of the wafer can be reduced. In addition, a space portion remaining in the end is buried with an insulating layer, so that a defect can be avoided in a junction surface of the epitaxial layers.

7 Claims, 10 Drawing Sheets

Prior Art

Prior Art

SEMICONDUCTOR DEVICE AND METHOD OF PROCESSING THE SAME

This application claims priority from Japanese Patent Application Number JP 2007-252200 filed on Sep. 27, 2007, the content of which is incorporated herein by reference in its entirety.

BACKGROUND OF THE INVENTION

1. Field of the Invention

The present invention relates to a method for processing a semiconductor wafer. In particular, the present invention relates to shortening a process of processing a semiconductor wafer achieving high breakdown voltage and low on-resistance and to a method for processing a semiconductor wafer with improved characteristics.

2. Description of the Related Art

As a silicon semiconductor wafer achieving high breakdown voltage and low on-resistance, known is a wafer structure in which pillar-like p type semiconductor regions and n type semiconductor regions are provided so as to form multiple pn junctions vertical to a wafer surface. This technology is described for instance in International Patent Publication No. WO02/067333, Pamphlet.

In this structure, when dopant concentrations and widths of the p type semiconductor regions and n type semiconductor regions are selected to be desired values, high breakdown voltage can be achieved in the pn junctions under application of reverse voltage. In the following, the description will be given by referring to such a structure as a super junction structure.

By referring to FIGS. 10A and 10B, and 11A to 11C, examples of a method for processing a semiconductor wafer with a super junction structure will be described.

As shown in FIG. 10A, an n+ type semiconductor substrate 11 is prepared, and an n type semiconductor layer (epitaxial layer) 12' with a thickness of approximately 6 μm, for example, is stacked on a surface of the substrate 11. Subsequently, a mask with openings at predetermined intervals is disposed on the layer 12'. Then, ions of a p type impurity are implanted into the openings to form p type semiconductor regions 13'.

After that, the step of stacking the n type semiconductor layers 12' (epitaxial growth) and the step of implanting ions of the p type impurity are repeated, for example, for seven times, to form a multi-layered epitaxial layer with a desired thickness (for example, approximately 42 μm). Finally, the ions of the p type impurity are diffused; thereby a wafer 20 with a super junction structure in which pillar-like n type semiconductor regions 12 and p type semiconductor regions 13 are alternately arranged is formed (FIG. 10B).

The following method is also known.

As shown in FIGS. 11A to 11C, an n type semiconductor layer (epitaxial layer) 22 with a desired thickness is stacked on an n+ type semiconductor substrate 21, for example, and multiple trenches 23 are then formed, so that pillar-like n type semiconductor layers remain (FIG. 1A). Thereafter, ions of a p type impurity are implanted obliquely into portions of the n type semiconductor layers 22, the portions exposed on the side walls of the trenches 23, to form pillar-like p type semiconductor regions 24 (FIG. 11B). Furthermore, insulating films 25 are buried respectively in positions between p type semiconductor regions 24. Thereby, a wafer 30 with a super junction structure is obtained (FIG. 11C).

As shown in FIGS. 10A and 10B, the conventional method for obtaining a wafer with a super junction structure requires the step of forming multiple epitaxial layers so as to stack the epitaxial layers in a thickness direction of the semiconductor wafer and the steps of ion implantation and diffusion. Thus, the conventional method has a problem that an extremely large number of processing steps are required.

In addition, the pillar-like semiconductor regions each have a shape in which multiple impurity diffusion regions are stacked. Accordingly, the side surfaces of the pillars (pn junctions) each have an undulate form. Thus, there is a problem that a depletion layer hardly spreads uniformly in a precise sense.

In a case of the method in which one portion of the pillar-like semiconductor layer is formed by oblique ion implantation as shown in FIGS. 11A to 11C, the trenches are each required to have a large width as shown in FIG. 11A, in order to have a uniform impurity profile of, for example, the p type semiconductor layer formed by the ion implantation, in a vertical direction to the wafer. For this reason, it is difficult to arrange multiple super junction structures in the wafer.

SUMMARY OF THE INVENTION

The invention provides a semiconductor wafer including a semiconductor substrate and a plurality of first epitaxial semiconductor layers of a first general conductivity type grown from the semiconductor substrate. The first epitaxial semiconductor layers stands on the semiconductor at a predetermined interval. The device also includes a second epitaxial semiconductor layer of a second general conductivity type grown from a corresponding first epitaxial semiconductor layer. The second epitaxial semiconductor layers stand on the semiconductor substrate and are in contact with corresponding first epitaxial semiconductor layers. The device further includes a third epitaxial semiconductor layer of the first general conductivity type grown from a corresponding second epitaxial semiconductor layer. The third epitaxial semiconductor layers stand on the semiconductor substrate and are in contact with corresponding second epitaxial semiconductor layers. The device also includes a plurality of insulating layers standing on the semiconductor substrate so that a first epitaxial semiconductor layer, two second epitaxial semiconductor layers and two third epitaxial semiconductor layers are disposed between two of the insulating layers.

The invention also provides a method for processing a semiconductor wafer. The method includes providing a semiconductor wafer of a first general conductivity type, growing a first epitaxial semiconductor layer of the first general conductivity type from the semiconductor wafer, etching the first epitaxial semiconductor layer to form a plurality of trenches, growing a second epitaxial semiconductor layer of a second general conductivity type from the etched first epitaxial semiconductor layer so as to leave a void in each trench, etching the second epitaxial semiconductor layer so as to expose the top surface of the first epitaxial semiconductor layer, growing a third epitaxial semiconductor layer of the first general conductivity type from the exposed top surface of the first epitaxial semiconductor layer and the etched second epitaxial semiconductor layer in the trenches so that the voids are filled at least partially with the third epitaxial semiconductor layer, etching the third epitaxial semiconductor layer so as to expose the top surface of the first epitaxial semiconductor layer and the top surface of the second epitaxial semiconductor layer, forming an insulating layer so as to cover the exposed top surfaces of the first and second epitaxial semiconductor layers and the etched third epitaxial semiconductor layer in the trenches so that the partially filled voids are filled with the insulating layer, and etching the insulating layer so as to expose the top surfaces of the first and second epitaxial semiconductor layers and a top surface of the third epitaxial semiconductor layer.

DETAILED DESCRIPTION OF THE INVENTION

Embodiments of the present invention will be described below in detail by exemplarily taking a case where a semiconductor substrate is an n type silicon semiconductor substrate by referring to FIGS. 1A, 1B, 1C, 2, 3A, 3B, 4, 5, 6, 7, 8A, 8B, 9A and 9B.

A semiconductor wafer according to a preferred embodiment of the present invention includes one-conductivity-type semiconductor substrate, first to third semiconductor layers, and an insulating layer. In the semiconductor wafer, multiple pn junctions are provided in the vertical direction to a semiconductor wafer surface.

Figure 1A:
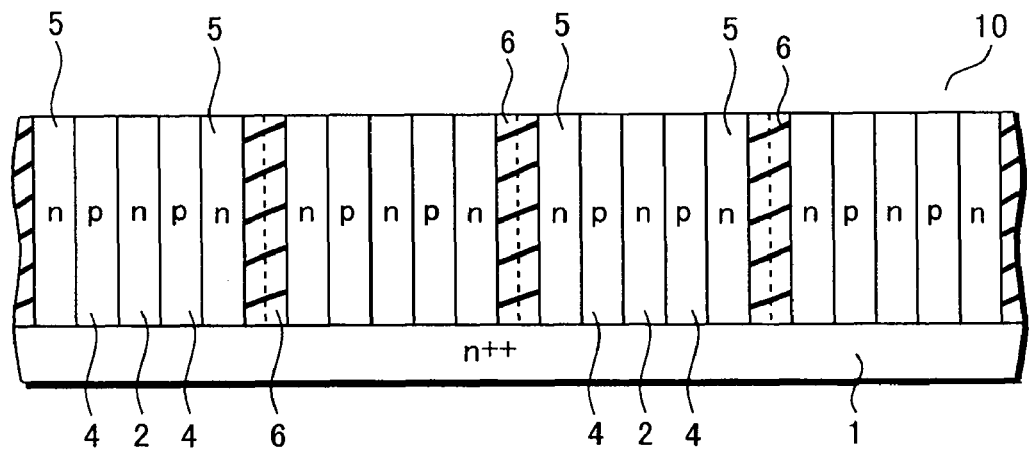
FIGS. 1A to 1D are respectively a cross-sectional view, a plan view, another plan view, and another a cross-sectional view each for illustrating a semiconductor wafer according to one embodiment of the present invention.
Figure 1B:
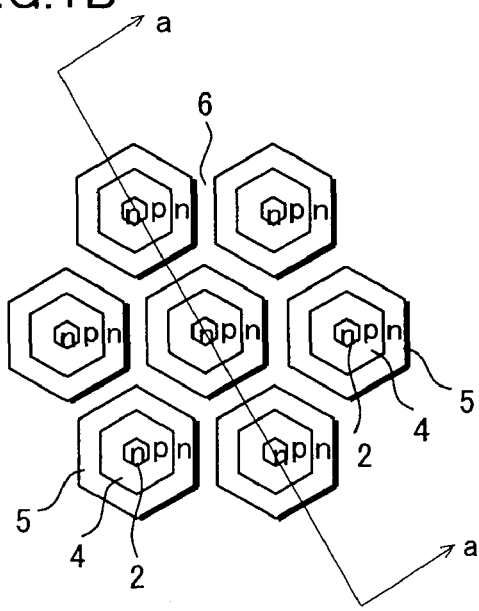
Figure 1C:
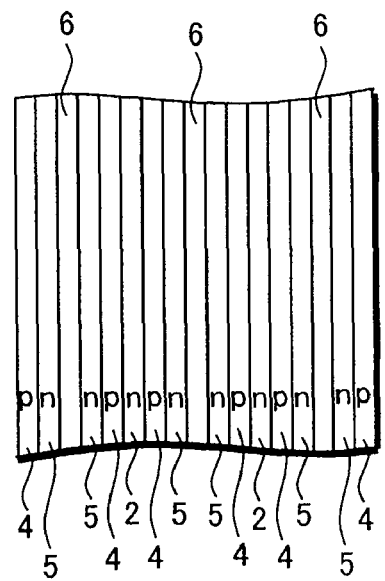

FIGS. 1A to 1C are views, each showing one example of a semiconductor wafer 10 according to the present embodiment. Specifically, FIG. 1A is a cross-sectional view, and FIGS. 1B and 1C are views, each showing a pattern of one principal surface of the semiconductor wafer 10. Note that, FIG. 1A is the cross-sectional view taken along the a-a line in FIG. 1B.

As shown in FIG. 1A, one-conductivity-type semiconductor substrate 1 is a high-concentration n type silicon semiconductor substrate with a dopant concentration of, for example, approximately $1 \times 10^{20}$ cm$^{-3}$.

Multiple first semiconductor layers 2 are provided on the semiconductor substrate 1 and are, for example, pillar-like n type epitaxial layers. The adjacent first semiconductor layers 2 are provided at intervals of a first distance L1 from the first semiconductor layer 2 (see, FIG. 3B). A width W1 of a pillar of the first semiconductor layer 2 in the cross-section in FIG. 1A is, for example, approximately 8 μm (see, FIG. 3B) and a dopant concentration is, for example, approximately $1 \times 10^{16}$ cm$^{-3}$.

It is noted that conductivity types such as P$^+$, P and P$^-$ belong in one general conductivity type, and conductivity types such as N$^+$, N and N$^-$ belong in another general conductivity type.

Multiple second semiconductor layers 4 are provided on the semiconductor substrate 1 and are, for example, pillar-like p type epitaxial layers. The second semiconductor layers 4 are provided on both sides of the first semiconductor layer 2 so as to be adjacent to the first semiconductor layer 2. The second semiconductor layers 4 being adjacent between the two adjacent first semiconductor layers 2 are provided at intervals of a second distance L2 (see, FIG. 5). A width W2 of a pillar of the second semiconductor layer 4 is, for example, approximately 8 μm and a dopant concentration is, for example, approximately $1 \times 10^{16}$ cm$^{-1}$.

Multiple third semiconductor layers 5 are provided on the semiconductor substrate 1 and are, for example, pillar-like n type epitaxial layers. The third semiconductor layers 5 are provided respectively on outer sides of the second semiconductor layers 4 so as to be adjacent to the second semiconductor layers 2. The third semiconductor layers 5 being adjacent between the two adjacent first semiconductor layers 2 are provided at intervals of a third distance L3 (see, FIG. 7). A width W3 of a pillar of the third semiconductor layer 5 is, for example, approximately 8 μm and a dopant concentration is, for example, approximately $1 \times 10^{16}$ cm$^{-3}$.

Multiple insulating films 6 are provided with being buried between the third semiconductor layers 5. The adjacent insulating layers 6 are provided at intervals of a fourth distance L4 (see, FIG. 8B). The insulating layer 6 is, for example, a spin-on-glass (SOG) layer, an oxide film or nitride film formed by a CVD method. The first to third semiconductor layers 2, 4, and 5 are provided between the adjacent insulating layers 6.

In the present embodiment, the first to third semiconductor layers 2, 4, and 5 are all formed of epitaxial layers. In other words, the present embodiment achieves the wafer 10 with a super junction structure (a super junction formed of a p type semiconductor layer and an n type semiconductor layer), having multiple pn junctions in the vertical direction to the semiconductor wafer surface by forming the epitaxial layers for at least three times.

Since the pillar-like semiconductor layers are all epitaxial layers, thicknesses thereof (widths W1, W2, and W3 of the pillars) can be desirably formed. Thereby, each of the first to third semiconductor layers 2, 4, and 5 can have an aspect ratio of a long side to a short side, which is 10 to 1 or the like, in the cross-section shown in FIG. 1A, that is, in the cross-section in which the multiple pn junctions of the semiconductor wafer 10 are exposed. This means that the widths W1, W2, and W3 (short sides) of the first to third semiconductor layers 2, 4, and 5 are extremely thin in relation to lengths (long sides) in the thickness direction of the semiconductor wafer 10.

If the widths W1, W2, and W3 of the pillars of the respective first to third semiconductor layers 2, 4, and 5 are narrow, dopant concentrations are increased. Thereby, critical field strength is increased. Thus, high breakdown voltage and low resistance can be achieved.

In addition, the first to third semiconductor layers 2, 4, and 5 are all epitaxial layers. Thereby, dopant concentration profiles in the depth direction of the semiconductor wafer 10 become uniform. Thus, a depletion layer can spread uniformly, unlike the case of the super junction structure formed by the ion implantation.

Figure 10A:
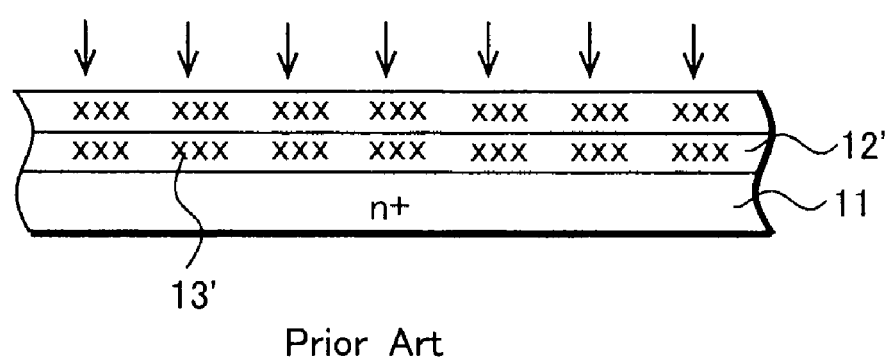
FIGS. 10A and 10B are cross-sectional views for illustrating the method for processing a semiconductor wafer in the conventional type.
Figure 10B:
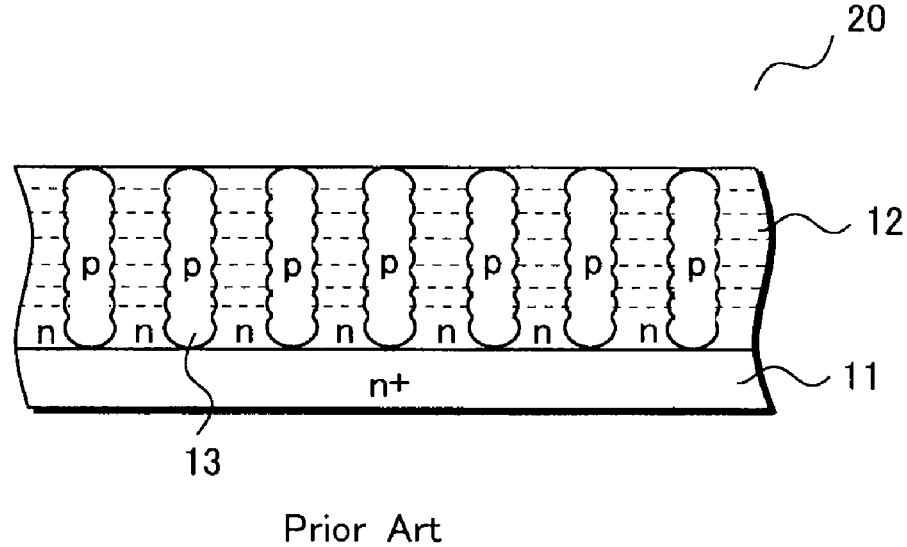
Figure 11A:
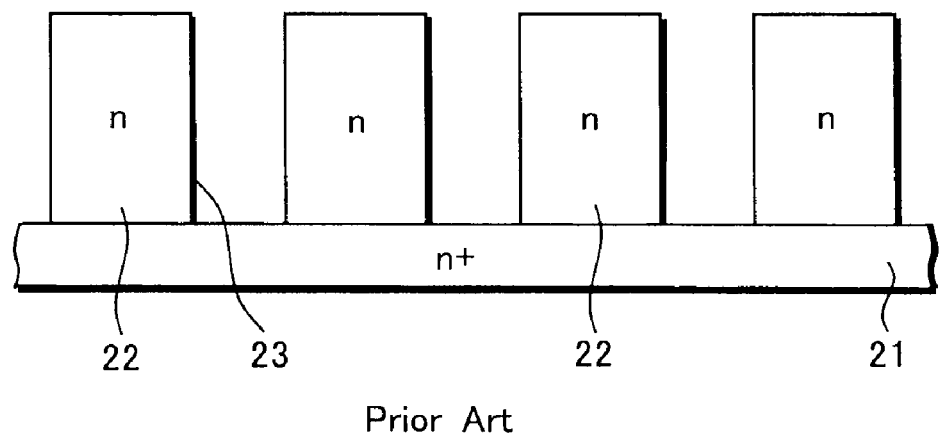
FIGS. 11A to 11C are cross-sectional views for illustrating the method for processing a semiconductor wafer in the conventional type.
Figure 11B:
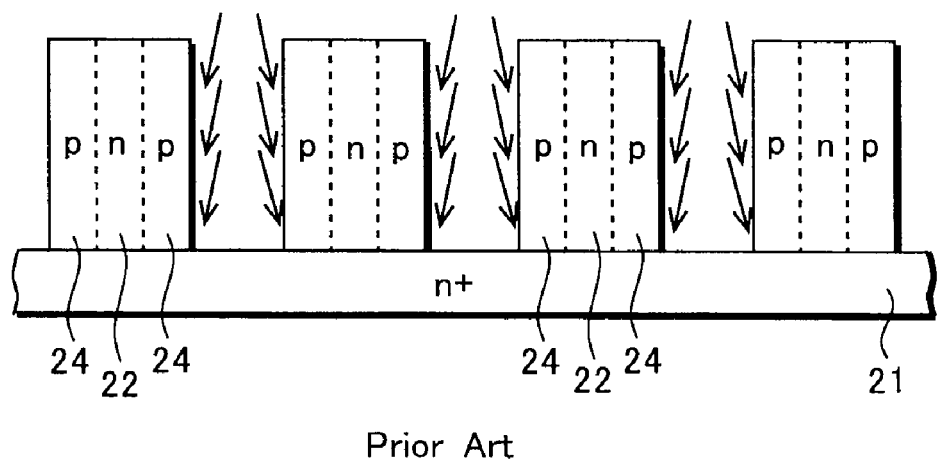
Figure 11C:
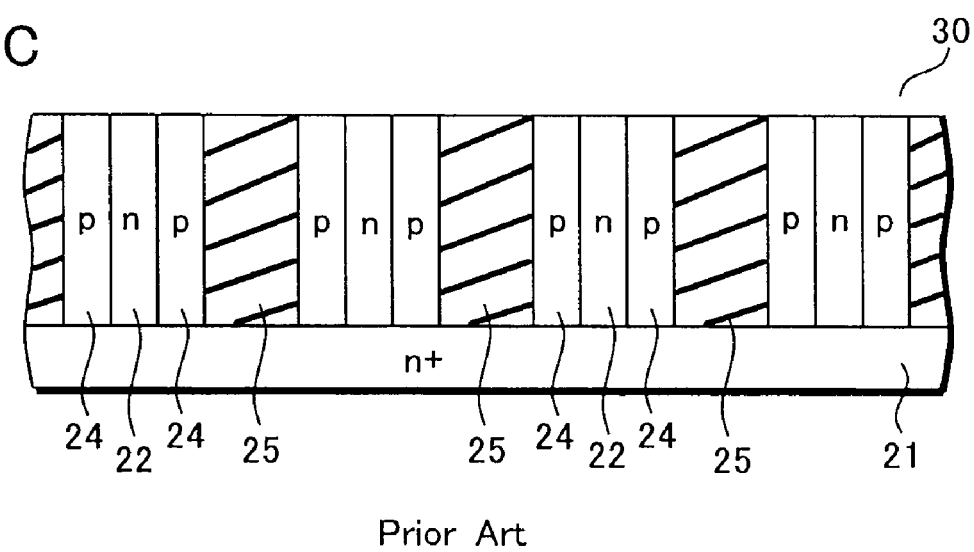

In addition, the first to third semiconductor layers 2, 4, and 5 are all epitaxial layers. Thereby, the pn junction surface can be vertically formed to the surface of the semiconductor wafer 10. As shown in FIGS. 10A and 10B, in the case of the super junction structure formed by repeatedly performing formation of a multiple epitaxial layers and ion implantation in the thickness direction of the semiconductor wafer, the pn junction surfaces become undulate practically. Thus, there is a problem that the depletion layer hardly spread uniformly in a precise sense. However, in the present embodiment, the pn junction surfaces are to be vertical surfaces in relation to the semiconductor wafer surface, which allows the depletion layer to spread uniformly.

In addition, in the present embodiment, the insulating film 6 is buried between the third semiconductor layers 5. Thereby, failures, such as a crystal defect or void which is likely to occur in the junction surface of the epitaxial layers can be avoided. This will be described in detail when a processing method thereof is described later.

Note that the case where the first to third semiconductor layers 2, 4, and 5 are provided between the insulating layers 6 is shown in FIG. 1A as one example. However, other pillar-like semiconductor layers may be provided between the insulating layers 6. In other words, the configuration is only needed that multiple semiconductor layers are provided so as to alternately have different conductivity types between the insulating layers 6 by forming an epitaxial layer for at least three times.

Figure 1D:
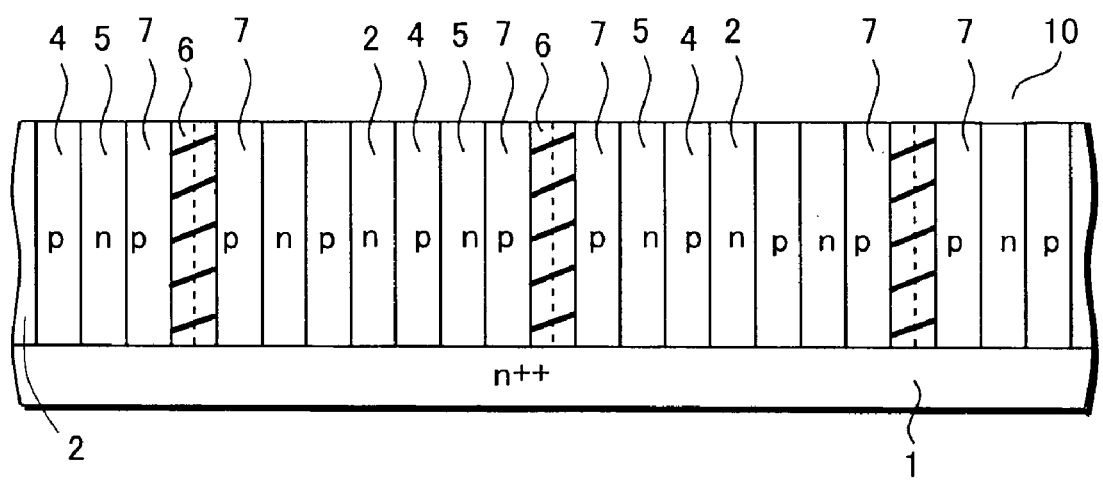
Figure 2:
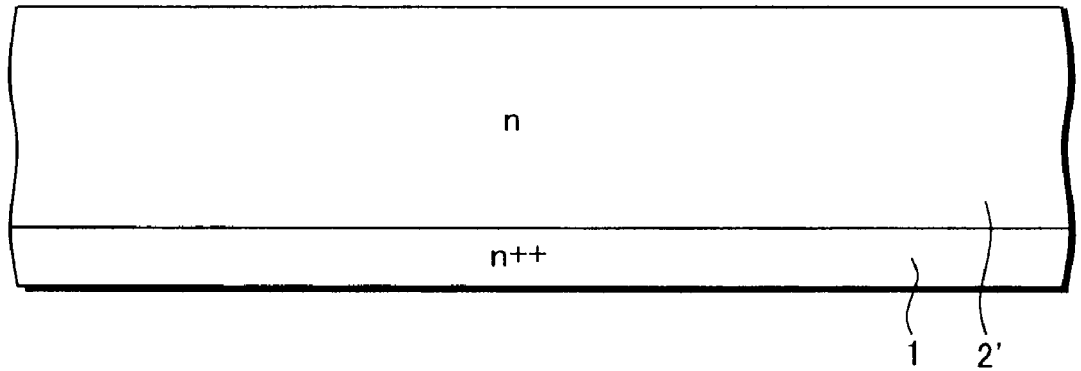
FIG. 2 is a cross-sectional view for illustrating a method for processing a semiconductor wafer in the embodiment of the present invention.

In other words, another pillar-like p type semiconductor layer 7 is provided after the third semiconductor layer 5 is formed (FIG. 1D). Furthermore, another pillar-like n type semiconductor layer may be also formed, and still another p type semiconductor layer and still another n type semiconductor layer may be further provided so that these layers would be alternately provided. After that, the insulating layer 6 is provided in a space portion S remaining in the end.

Even in such a case, the aspect ratio of the long side to the short side in the cross-section in which the multiple pn junctions of the semiconductor wafer are exposed becomes 10 to 1 or the like because the other semiconductor layers are epitaxial layers. In addition, the dopant concentration profiles of the other semiconductor layers become uniform in the vertical direction to the semiconductor wafer surface.

In addition, in FIG. 1A, the case where all the semiconductor layers forming the super junctions reach the semiconductor substrate 1 is shown. However, the first semiconductor layer 2 may remain on the surface of the semiconductor substrate 1. In this case, the p type semiconductor layer does not reach the semiconductor substrate 1.

As shown in FIG. 1B, the p type semiconductor layers and n type semiconductor layers, which form the super junctions, are hexagonal pillars in the pattern on the one principal surface of the semiconductor wafer 10. Specifically, the n type semiconductor layers and p type semiconductor layers are alternately provided with a concentric hexagonal state, and the insulating layer 6 is provided therebetween.

In addition, FIG. 1C shows a pattern according to another embodiment. As shown in FIG. 1C, the pattern on the one principal surface of the semiconductor wafer may be a stripe form.

By referring to FIGS. 2, 3A, 3B, 4, 5, 6, 7, 8A, 8B, 9A and 9B, a method for processing the semiconductor wafer according to the present embodiment will be described.

First step (FIG. 2): Firstly, an n type silicon semiconductor substrate 1 with a high dopant concentration of approximately $1 \times 10^{20}$ cm$^{-3}$ is prepared. An n type epitaxial layer 2' is formed on the semiconductor substrate 1 as a first epitaxial layer by an epitaxial growth method. The thickness of the n type epitaxial layer 2' in this step is to be the thickness of a super junction of a semiconductor wafer.

A dopant concentration of an n type epitaxial layer 2' is, for example, approximately $1 \times 10^{16}$ cm$^{-3}$ and a thickness thereof is, for example, approximately 40 μm.

Figure 3A:
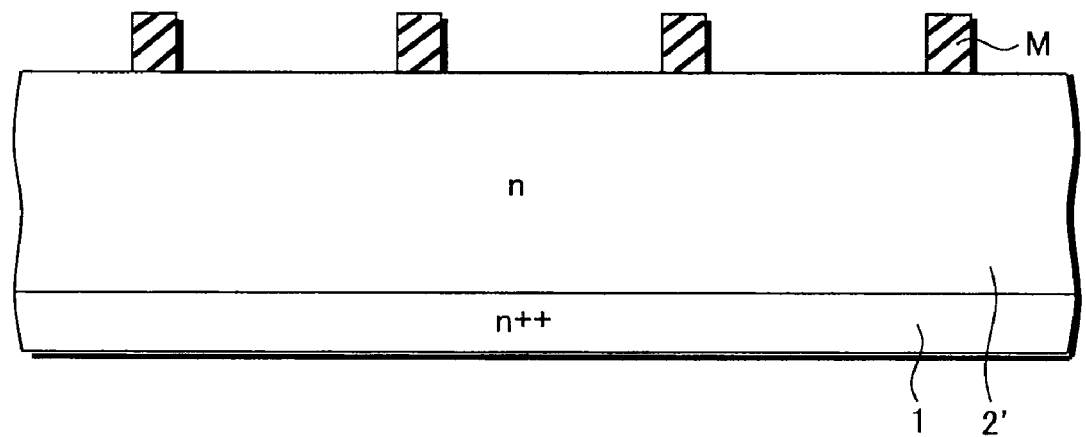
FIGS. 3A and 3B are cross-sectional views for illustrating the method for processing a semiconductor wafer in the embodiment of the present invention.

Second step (FIGS. 3A and 3B): As shown in FIG. 3A, a mask with a desired opening width is provided on the surface of the n type epitaxial layer 2' and the n type epitaxial layer 2' is dry-etched. Thereby, multiple trenches 3 are formed with a depth through which, for example, the first semiconductor substrate 1 is exposed.

The dry etching may be performed until the semiconductor substrate 1 is exposed or the n type epitaxial layer 2' may remain on the bottom portions of the trenches 3. The present embodiment shows a case where the semiconductor substrate 1 is exposed.

Figure 3B:
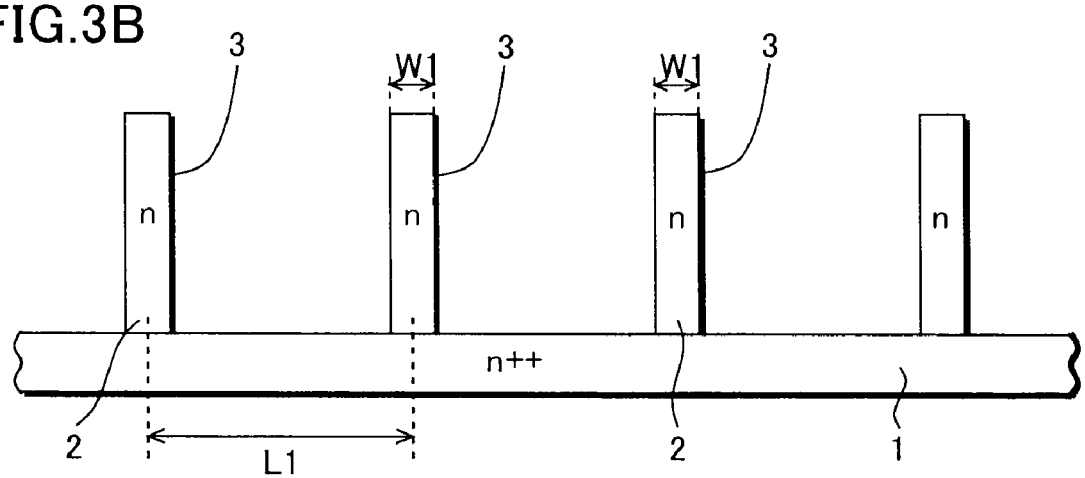
Figure 4:
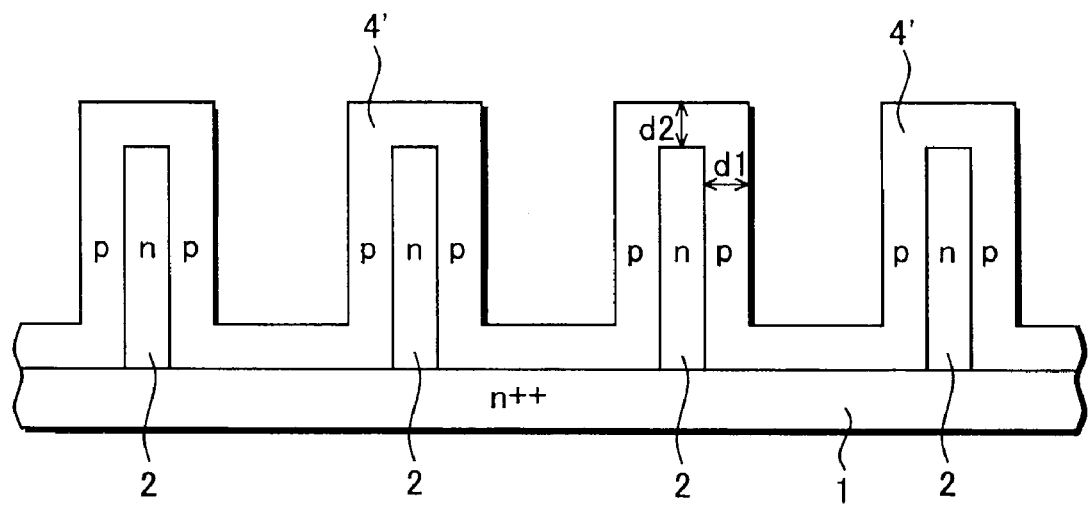
FIG. 4 is a cross-sectional view for illustrating the method for processing a semiconductor wafer in the embodiment of the present invention.
Figure 5:
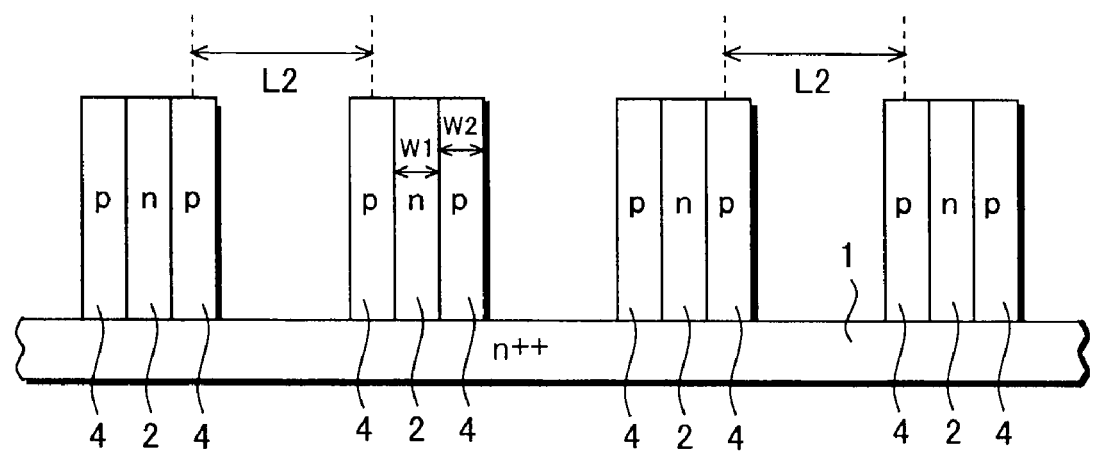
FIG. 5 is a cross-sectional view for illustrating the method for processing a semiconductor wafer in the embodiment of the present invention.
Figure 6:
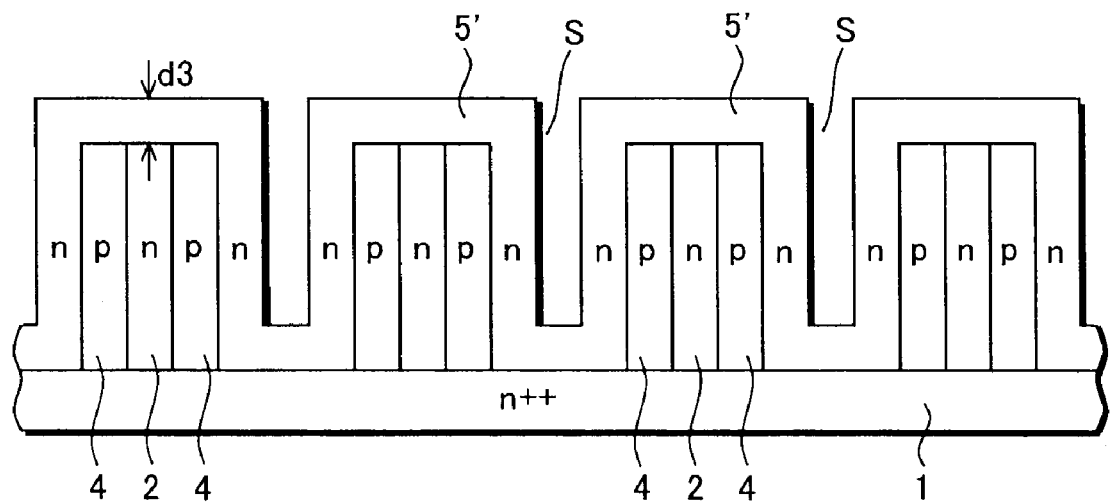
FIG. 6 is a cross-sectional view for illustrating the method for processing a semiconductor wafer in the embodiment of the present invention.
Figure 7:
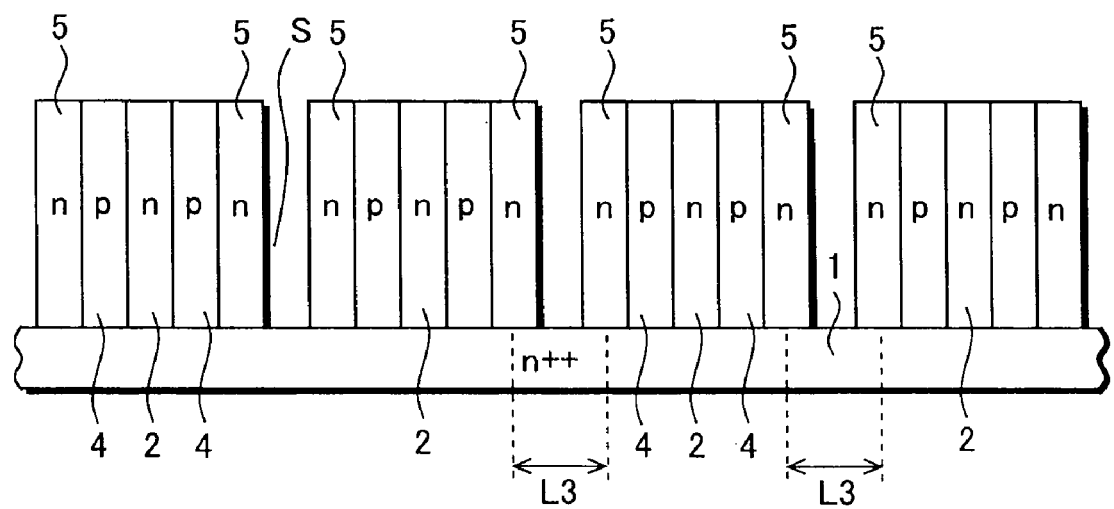
FIG. 7 is a cross-sectional view for illustrating the method for processing a semiconductor wafer in the embodiment of the present invention.

Thereby, the first semiconductor layer 2 of the multiple, for example, pillar-like n type first semiconductor layers 2, which at intervals of the first distance L1 in the cross-section shown in FIG. 3B (for example, approximately 30 μm), has the width W1, for example, approximately 8 μm.

After the trenches 3 are formed, thermal oxidation is performed, for example, at 1100° C. for 10 minutes. Thereafter, a thermally-oxidized film is removed by wet etching to remove a damaged layer damaged due to trench etching.

Third step (FIG. 4): On the semiconductor substrate 1, a second epitaxial layer (p type epitaxial layer) 4' with an opposite conductivity type of the first epitaxial layer 2' (first semiconductor layer 2) is formed by an epitaxial growth method. Note that, if the first epitaxial layer (n type epitaxial layer 2') remains on the bottom portions of the trenches 3 in the second step, the p type epitaxial layer 4' is formed on the remaining n type epitaxial layer 2'. A dopant concentration of the p type epitaxial layer 4' is, for example, approximately $1 \times 10^{16}$ cm$^{-3}$.

The p type epitaxial layer 4' is formed so as to cover sides and upper surfaces of the pillar-like first semiconductor layers 2 and, here, the semiconductor substrate 1 which is exposed between the first semiconductor layers 2. In addition, the p type epitaxial layer 4' has a thickness in the side surface of the first semiconductor layer 2 (a thickness d1 in the horizontal direction of the semiconductor substrate 1) and a thickness d2 in the upper surface of the first semiconductor layer 2 or the surface of the semiconductor substrate 1, and both of the thicknesses d1 and d2 are substantially equal.

Fourth step (FIG. 5): The overall anisotropic etching is performed on the p type epitaxial layer 4' without providing a mask. By performing the etching until the semiconductor substrate 1 between the first semiconductor layers 2 is exposed, the upper surfaces of the first semiconductor layers 2 are exposed because the p type epitaxial layer 4' covering the upper surfaces of the first semiconductor layers 2 is also removed. Note that, if the first epitaxial layer 2' remains in the bottom portions of the trenches 3 in the second step, the etching is performed until the remaining first epitaxial layer 2' is exposed.

In contrast, the p type epitaxial layer 4' on the side surface of the first semiconductor layer 2 is not removed. Thereby, pillar-like p type second semiconductor layers 4, which are adjacent on both sides of the first semiconductor layer 2, are formed. The second semiconductor layers 4 adjacent between the first semiconductor layers 2 keep an interval of a second distance L2. The width W2 of the second semiconductor layer 4 is the thickness d1 (=d2) of the p type epitaxial layer 4' and is approximately 8 μg/m here. Note that, the width W1 of the first semiconductor layer 2 and the width W2 of the second semiconductor layer 4 can be appropriately selected based on the characteristics thereof. When these widths are narrowed, dopant concentrations are increased. Thus, high breakdown voltage and low resistance can be achieved.

Fifth step (FIG. 6): Furthermore, a third epitaxial layer (n type epitaxial layer) 5' with the same conductivity type as that of the first epitaxial layer 2' is formed on the semiconductor substrate 1 by the epitaxial growth method. Note that, if the first epitaxial layer (n type epitaxial layer 2') remains on the bottom portions of the trenches 3 in the second step, the n type epitaxial layer 5' is formed on the remaining n type epitaxial layer 2'. A dopant concentration of the n type epitaxial layer 5' is, for example, approximately $1 \times 10^{16}$ cm$^{-3}$ and has a thickness d3 of approximately 8 μm.

The n type epitaxial layer 5' is formed so as to cover sides and upper surfaces of the pillar-like second semiconductor layers 4 and the upper surface of the first semiconductor layer 2. Then, the n type epitaxial layer 5' is formed in a position between the adjacent second semiconductor layers 4.

Sixth step (FIG. 7): The overall anisotropic etching is performed on the n type epitaxial layer 5' without providing a mask. The etching is performed until the upper surfaces of the first semiconductor layers 2 and the second semiconductor layers 4 are exposed. Thereby, pillar-like n type third semiconductor layers 5, which are adjacent to both sides of the second semiconductor layers 4, are formed. The third semiconductor layers adjacent to each other having the first semiconductor layers 2 interposed in between keep an interval of a third distance L3. The width W3 of the third semiconductor layer 5 equals to the width W1 of the first semiconductor layer 2. Note that, in the semiconductor layer coming in contact with the insulating layer 6 (the third semiconductor layer here), a depletion layer does not spread from the side coming in contact with the insulating layer 6. Accordingly, the width W3 of the third semiconductor layer 5 should not necessarily be equal to the width W1 of the first semiconductor layer 2. When the area of the semiconductor layer coming in contact with the insulating layer 6 is too large, an actual operation area becomes smaller. Thus, it is only needed that the width W3 is approximately between W1 and ½W1.

With this process, a trench-like space portion S remains between the adjacent (opposed) third semiconductor layers 5 with a width which, for example, equals to that of the third semiconductor layer 5. Note that, the width of the space portion S may be wider than the width W3 of the third semiconductor layer 5. However, if the space portion S becomes too large, an actual operation area becomes smaller. Thus, the comparable width would be large enough.

Figure 8A:
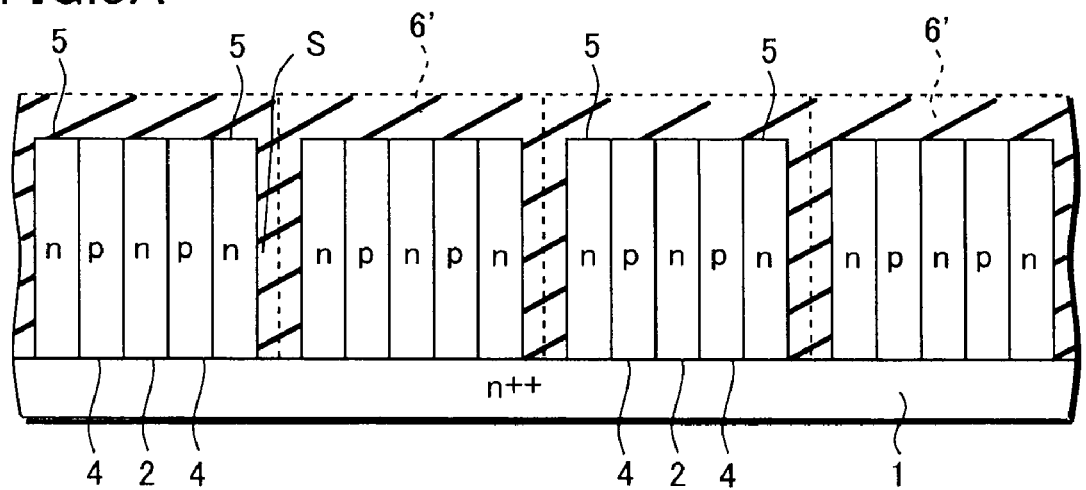
FIG. 8A-8D is a cross-sectional view for illustrating the method for processing a semiconductor wafer in the embodiment of the present invention.

Seventh step (FIGS. 8A and 8B): After a thermal oxidation is performed on the entire surface (for example, at 1100° C. for 10 minutes), an insulating film 6' is formed on the entire surface by the CVD method or forming an SOG film. The insulating layer is an oxide film, a nitride film, an SOG film, or the like (FIG. 8A). Note that, a thermal oxidation film is not needed to be formed.

Thereafter, the entire surface is etched to remove the insulating film 6' on the surface. Thereby, the pillar-like insulating layers 6 buried in the space portion S between the third semiconductor layers 5 are formed. The pillar-like insulating layer 6 comes in contact with the third semiconductor layers 5 respectively on the outer sides of the third semiconductor layers 5 (FIG. 8B).

As described above, in the present embodiment, all the pillar-like semiconductor layers forming the super junctions are formed of epitaxial layers so that the super junction structure having multiple pn junctions in the vertical direction to the semiconductor wafer surface is achieved. The space portion S remaining in the end is buried with the insulating layer 6.

Figure 8B:
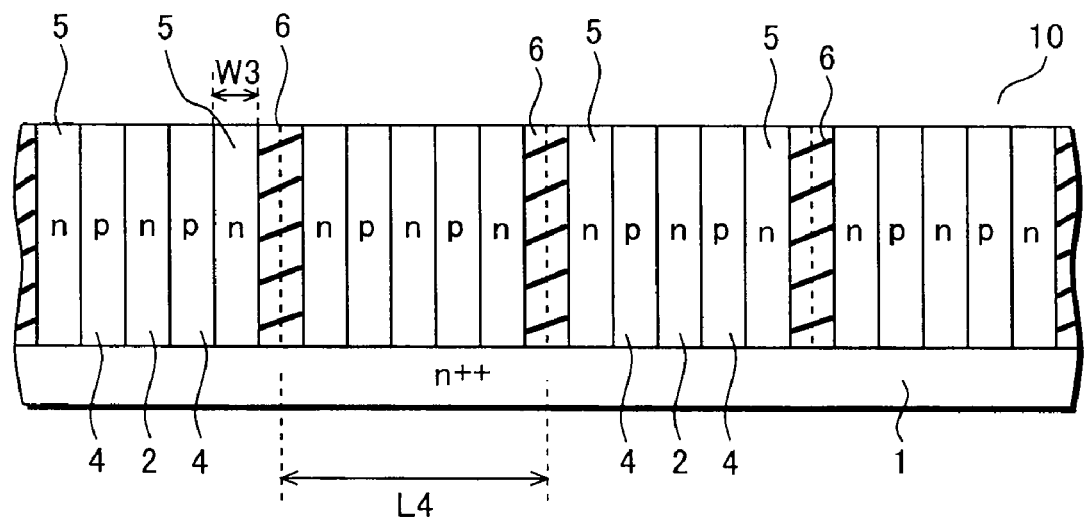

Note that in FIGS. 8A and 8B, the case where the first to third semiconductor layers 2, 4, and 5 are provided between the adjacent insulating layers 6 is described as an example. However, if the opening width of the trench 3 is wide, a pillar-like semiconductor layer may be further repeatedly formed.

In other words, by repeating the third to sixth steps, a step of forming another epitaxial layer (for example, p type epitaxial layer) and a step of etching the another epitaxial layer are repeated to alternately form other pillar-like semiconductor layers being adjacent to each other.

Figure 8C:
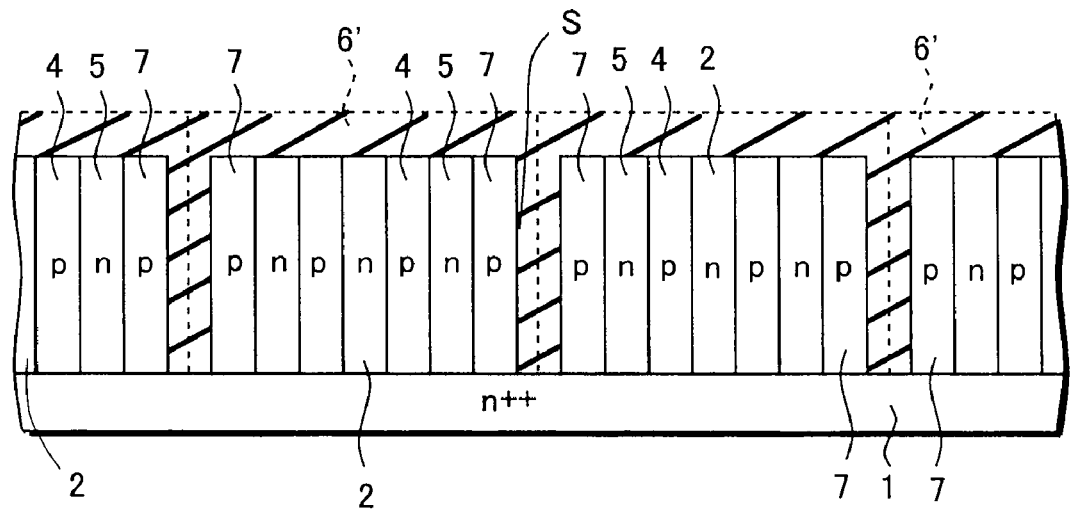
Figure 8D:
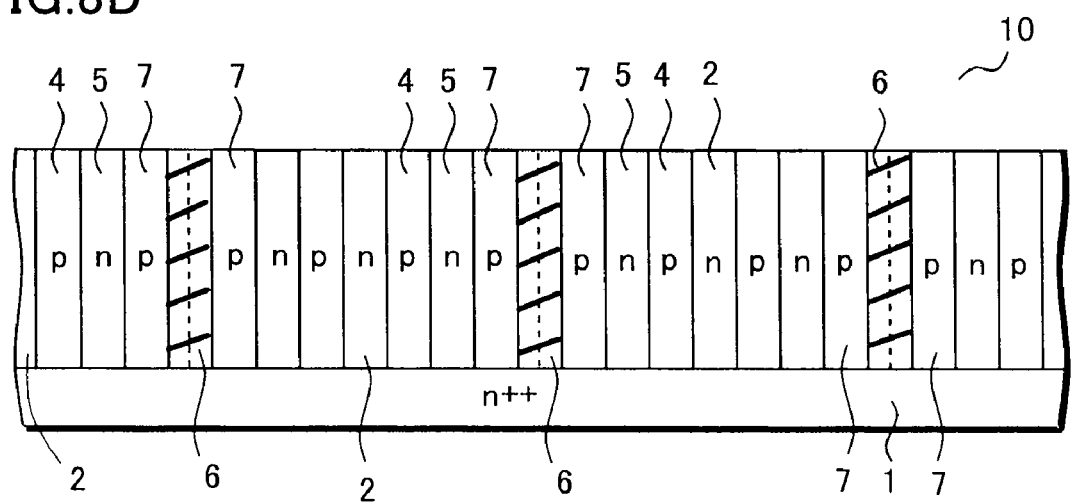

In other words, a p type epitaxial layer is formed after the third semiconductor layer 5 is formed, and then the p type epitaxial layer is etched. Thereby, another pillar-like p type semiconductor layer 7 is formed (FIGS. 8C and 8D). Furthermore, it is also possible that an n type epitaxial layer is formed and then the n type epitaxial layer is etched so as to form another pillar-like n type semiconductor layer. Also, a p type semiconductor layer and an n type semiconductor layer may be further formed so that these semiconductor layers would be alternate.

In this case, all the pillar-like semiconductor layers are also formed of epitaxial layers. Thereby, widths thereof can be desirably formed. In other words, the widths of the respective semiconductor layers can be narrowed. Thereby, dopant concentrations are increased and thus critical field strengths are increased. Thus, high breakdown voltage and low resistance can be achieved.

In addition, dopant concentration profiles of the respective semiconductor layers become uniform and pn junction surfaces are formed vertically to the surface of the semiconductor wafer 10. Thereby, a depletion layer can spread uniformly. Thus, a method for processing a semiconductor wafer, with which characteristics of a super junction structure can be sufficiently utilized, can be provided.

As described above, in the method for processing the semiconductor wafer according to the present embodiment, the formation and etching of an n type epitaxial layer and the formation and etching of a p type epitaxial layer are alternately repeated for at least three times on the semiconductor substrate 1. Then, all the semiconductor layers forming the super junctions are formed by the epitaxial growth method. In addition, the insulating layer 6 is formed in the space portion S between the third semiconductor layers 5 (between other semiconductor layers facing to each other).

Since the insulating layer 6 is formed in the space portion S, a crystal defect or void which is likely to occur in the junction surface of the epitaxial layers, can be avoided.

This will be described by referring to FIGS. 9A and 9B.

Figure 9A:
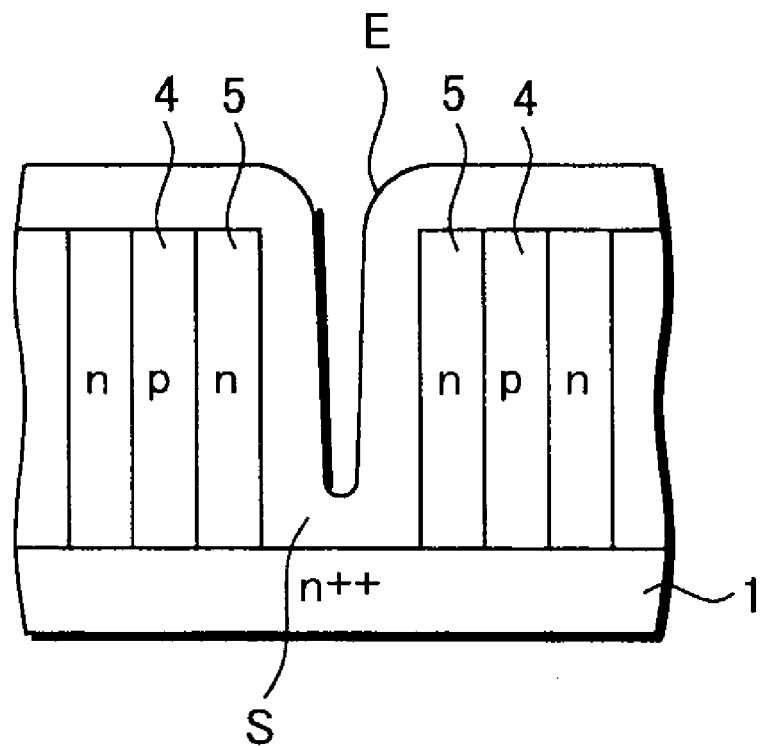
FIGS. 9A and 9B is a cross-sectional view for illustrating a semiconductor wafer and a method for processing the semiconductor wafer in the embodiment of the present invention.
Figure 9B:
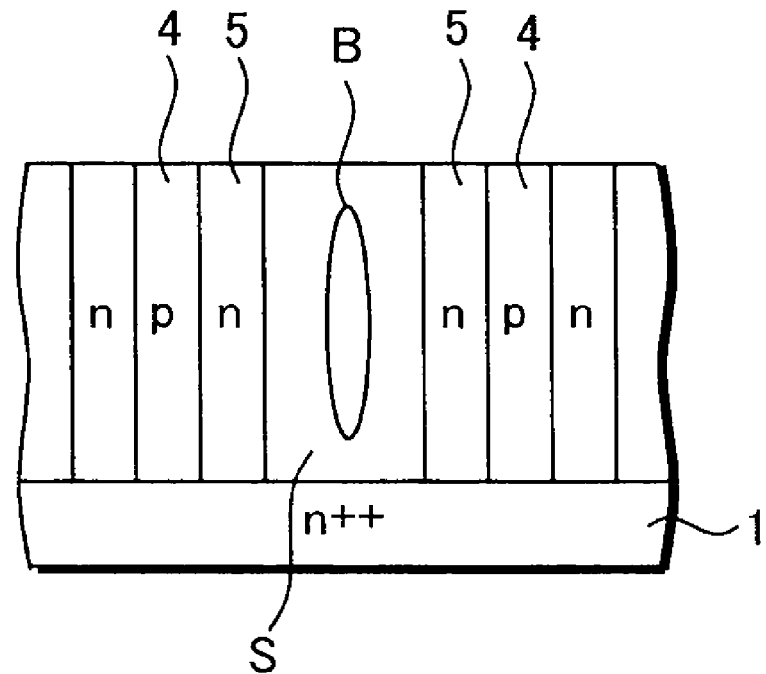

FIGS. 9A and 9B are enlarged views, each showing a case where the space portion S remaining in the end is buried with an epitaxial layer E.

As shown in FIG. 9A, the epitaxial layer E grows from the side surface of the third semiconductor layer 5 toward the center of the space portion S. Then, as shown in FIG. 9B, the epitaxial layers grown from the both sides join at the center of the space portion S. However, at this time, it is likely to occur that directions of single crystals of the epitaxial layers become misaligned to cause crystal defects or the junction in the vicinity of the center is not sufficient to cause voids B.

In the semiconductor wafer with the super junction structure, the pillar-like p type semiconductor layer or n type semiconductor layer greatly affects elements formed on the semiconductor wafer. Accordingly, it is not preferable that crystal defects or voids are caused therein.

Accordingly, in the present embodiment, the insulating film 6 is buried in the space portion S remaining in the end. In this case, the insulating layer 6' is also formed, in a manner similar to the epitaxial layer shown in FIGS. 9A and 9B. Thus, there is a case where a void is caused in the vicinity of the center of the space portion S.

However, the critical field strength is high in the insulating layer 6. Thus, even if the void or crystal defect is caused, the characteristics of the semiconductor wafer are not affected.

As described above, in the present embodiment, the case where the n type silicon semiconductor substrate is used as the semiconductor substrate 1 is described. However, a p type silicon semiconductor substrate may also be used. In addition, the case where the n type semiconductor layer (epitaxial layer) is formed in the first step is described as an example. However, the present embodiment can be similarly implemented by forming a p type semiconductor layer in place of the n type semiconductor layer.

According to the present embodiment of the invention, the following effects can be obtained.

Firstly, the p type semiconductor layers and n type semiconductor layers forming the super junctions are all epitaxial layers. Thereby, the structure in which the p type semiconductor layers and the n type semiconductor layers are repeatedly provided can be achieved. In the structure, dopant concentration profiles of the p type semiconductor layers and the n type semiconductor layers are each uniform in the vertical direction to the surface of the semiconductor wafer. Thus, the semiconductor wafer with the super junction in which the depletion layer spreads uniformly can be provided.

Secondly, the semiconductor layers forming the super junctions are all epitaxial layers. Thus, the pn junction surfaces can be formed vertically to the surface of the semiconductor wafer. In the super junction structure which is formed by repeating formation of an epitaxial layer and ion implantation so as to form multiple epitaxial layers in the thickness direction of the semiconductor wafer, the pn junction surfaces result in being undulate in actual. Thus, there is a problem that the depletion layer hardly spreads uniformly in a precise sense. However, in the present embodiment, the pn junction surfaces are each formed vertically to the upper surface of the semiconductor wafer, which also allows the depletion layers to spread uniformly.

Thirdly, all the semiconductor layers forming the super junctions are epitaxial layers. Thereby, widths of the respective semiconductor layers (i.e. lengths of short sides) in the cross-section of the semiconductor wafer including multiple pn junctions can be formed so as to have desired values.

In other words, the widths of the semiconductor layers can be reduced compared to those of the conventional semiconductor layers. By reducing the widths of the semiconductor layers, the pinch-off width of the depletion layer spreading in each of the semiconductor layers also decreases. Meanwhile, if the same breakdown voltage is maintained, the dopant concentrations of the semiconductor layers can each be increased by reducing the width of the semiconductor layer. Accordingly, the resistance of the semiconductor wafer to be a current path when a forward voltage is applied can be further reduced.

Fourthly, the p type semiconductor layers and the n type semiconductor layers forming the super junctions are repeatedly formed. Then, the insulating layer is finally buried in the space portion between the semiconductor layers. Thereby, crystal defects caused in junction portions of the epitaxial layers can be prevented.

Specifically, if all the p type semiconductor layers and n type semiconductor layers are formed of epitaxial layers, the epitaxial layers finally buried come in contact around the substantially center of the remaining space portion. However, there is a case in which the junction between the single crystals of the epitaxial layers grown from both sides is misaligned or in which a void is caused in the junction surface. Thus, the characteristics as a semiconductor wafer may be deteriorated.

However, the defect in the junction surface of the epitaxial layer can be avoided by using an insulating layer as a material to be finally buried in the space portion between the semiconductor layers.

Fifthly, the process for processing the semiconductor wafer can be shortened, when compared with the case of a conventional method in which multiple epitaxial growth and ion implantation are performed in the thickness direction of the semiconductor wafer so as to form multiple pn junctions.

What is claimed is:

1. A semiconductor wafer comprising:
a semiconductor substrate;
a plurality of first epitaxial semiconductor layers of a first general conductivity type grown from the semiconductor substrate, the first epitaxial semiconductor layers standing on the semiconductor at a predetermined interval;
a plurality of second epitaxial semiconductor layers of a second general conductivity type grown from corresponding first epitaxial semiconductor layers, the second epitaxial semiconductor layers standing on the semiconductor substrate and being in contact with the corresponding first epitaxial semiconductor layers;
a plurality of third epitaxial semiconductor layers of the first general conductivity type grown from corresponding second epitaxial semiconductor layers, the third epitaxial semiconductor layers standing on the semiconductor substrate and being in contact with the corresponding second epitaxial semiconductor layers; and
a plurality of insulating layers standing on the semiconductor substrate so that a third epitaxial semiconductor layer, a second epitaxial semiconductor layer, a first epitaxial semiconductor layer, another second epitaxial semiconductor layer and another third epitaxial semiconductor layer are disposed in this order between two insulating layers with no other insulating layer being disposed between the two insulating layers,
wherein epitaxial semiconductor layers in contact with the insulating layers are of the same general conductivity type.

2. The semiconductor wafer according to claim 1, further comprising a plurality of fourth epitaxial semiconductor layers of the second general conductivity type grown from corresponding third epitaxial semiconductor layers, the fourth epitaxial semiconductor layers standing on the semiconductor substrate and being in contact with the corresponding third epitaxial semiconductor layers.

3. The semiconductor wafer according to claim 2, wherein impurity concentration profiles of the first to fourth epitaxial semiconductor layers are uniform in a direction normal to the semiconductor substrate.

4. A method for processing a semiconductor wafer, comprising:
- providing a semiconductor wafer of a first general conductivity type;
- growing a first epitaxial semiconductor layer of the first general conductivity type from the semiconductor wafer;
- etching the first epitaxial semiconductor layer to form a plurality of trenches;
- growing a second epitaxial semiconductor layer of a second general conductivity type from the etched first epitaxial semiconductor layer so as to leave a void in each trench;
- etching the second epitaxial semiconductor layer so as to expose a top surface of the first epitaxial semiconductor layer;
- growing a third epitaxial semiconductor layer of the first general conductivity type from the exposed top surface of the first epitaxial semiconductor layer and the etched second epitaxial semiconductor layer in the trenches so that the voids are filled at least partially with the third epitaxial semiconductor layer;
- etching the third epitaxial semiconductor layer so as to expose the top surface of the first epitaxial semiconductor layer and a top surface of the second epitaxial semiconductor layer;
- forming an insulating layer so as to cover the exposed top surfaces of the first and second epitaxial semiconductor layers and the etched third epitaxial semiconductor layer in the trenches so that the partially filled voids are filled with the insulating layer; and
- etching the insulating layer so as to expose the top surfaces of the first and second epitaxial semiconductor layers and a top surface of the third epitaxial semiconductor layer.

5. The method of claim 4, wherein the formation of the trenches comprises removing a damaged layer by thermal oxidation of the first epitaxial semiconductor layer.

6. The method of claim 4, further comprising growing, prior to the formation of the insulating layer, a fourth epitaxial semiconductor layer of the second general conductivity type from the exposed top surfaces of the first, second and third epitaxial semiconductor layers and the etched third epitaxial semiconductor layer in the voids, and etching the fourth epitaxial semiconductor layer so as to expose the top surfaces of the first, second and third epitaxial semiconductor layers and a top surface of the fourth epitaxial semiconductor layer.

7. The method of claim 6, wherein impurity concentration profiles of the first to fourth epitaxial semiconductor layers are uniform in a direction normal to the semiconductor wafer.

* * * * *